United States Patent
John et al.

(10) Patent No.: US 9,786,770 B1
(45) Date of Patent: Oct. 10, 2017

(54) SEMICONDUCTOR DEVICE STRUCTURE WITH NON PLANAR SLIDE WALL

(71) Applicant: FREESCALE SEMICONDUCTOR, INC., Austin, TX (US)

(72) Inventors: Jay Paul John, Austin, TX (US); Vishal Trivedi, Austin, TX (US); James Albert Kirchgessner, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/286,988

(22) Filed: Oct. 6, 2016

(51) Int. Cl.
| | |
|---|---|
| *H01L 29/735* | (2006.01) |
| *H01L 29/66* | (2006.01) |
| *H01L 21/265* | (2006.01) |
| *H01L 21/311* | (2006.01) |
| *H01L 29/08* | (2006.01) |

(52) U.S. Cl.
CPC ...... *H01L 29/735* (2013.01); *H01L 21/26513* (2013.01); *H01L 21/31116* (2013.01); *H01L 29/0821* (2013.01); *H01L 29/6625* (2013.01)

(58) Field of Classification Search
CPC ............. H01L 29/735; H01L 21/26513; H01L 21/31116; H01L 29/0821; H01L 29/6625; H01L 21/3115; H01L 21/31155; H01L 29/0808; H01L 29/1008
See application file for complete search history.

(56) References Cited

U.S. PATENT DOCUMENTS

| | | | |
|---|---|---|---|
| 5,316,965 A | 5/1994 | Philipossian et al. | |
| 7,816,221 B2 | 10/2010 | John et al. | |
| 7,880,270 B2 | 2/2011 | Heinemann et al. | |
| 8,754,450 B2 | 6/2014 | Miu et al. | |
| 8,933,537 B2 | 1/2015 | Fox et al. | |
| 2009/0321788 A1* | 12/2009 | John | H01L 29/0649 257/197 |
| 2011/0281425 A1* | 11/2011 | Tamura | B81C 1/00103 438/585 |
| 2013/0134483 A1 | 5/2013 | Adkisson et al. | |
| 2015/0333138 A1* | 11/2015 | Nishi | H01L 29/42316 257/256 |

FOREIGN PATENT DOCUMENTS

TW 492082 B 6/2002

* cited by examiner

*Primary Examiner* — Yasser A Abdelaziez (57) ABSTRACT

A semiconductor device that includes a semiconductor structure having a side wall that is non planar and that extends farther outward at an upper portion than at a lower portion of the side wall. The semiconductor structure extends underneath a semiconductor layer wherein a top portion of the structure contacts the semiconductor layer.

14 Claims, 11 Drawing Sheets

SEMICONDUCTOR DEVICE STRUCTURE WITH NON PLANAR SLIDE WALL

BACKGROUND OF THE INVENTION

Field of the Invention

This invention relates in general to a semiconductor device and more specifically to a structure of a semiconductor device with a non planar sidewall.

Description of the Related Art

A semiconductor device such as a transistor utilizes regions of doped semiconductor material to form the structures of the device. For example, a bipolar transistor may include an intrinsic base of doped semiconductor material in contact with an intrinsic collector and intrinsic emitter.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Described herein is a semiconductor structure of a semiconductor device that has a side wall that is non planar and that extends farther outward at an upper portion than at a lower portion of the side wall. The semiconductor structure extends underneath a semiconductor layer wherein a top portion of the structure contacts the semiconductor layer. The bottom portion of the semiconductor structure contacts an oppositely doped second semiconductor structure below. In one embodiment, having the upper portion of the semiconductor structure extend out further than the lower portion allows for an increase in the surface area of the semiconductor structure in contact with the semiconductor layer above to reduce the resistance between the two while minimizing the area of the bottom surface of the semiconductor structure to reduce the capacitance with the oppositely doped semiconductor structure below.

In one example, the sidewall is formed by providing an upper portion of a layer of a dielectric material with a faster etch property than a lower portion of the layer. In one embodiment, the faster etch property is provided by changing the doping profile of the upper portion versus the lower portion (e.g. by ion implantation or by in-situ doping). The semiconductor layer is formed over the layer of dielectric material. An opening is formed in the layer of semiconductor material wherein the layer of dielectric material is exposed through the opening. The layer of dielectric material is isotropically etched through the opening wherein a portion of the layer of dielectric material underneath the layer of semiconductor material is removed. In one embodiment, the upper portion of the layer of dielectric material is etched at a faster rate due to the dopants such that a side wall of the remaining portion of the layer of dielectric material underneath the layer of semiconductor material has an upper portion that extends laterally farther from the opening than the lower portion of the wall. Semiconductor material is formed in a void formed by the etching of the layer of dielectric material such that the newly formed semiconductor material contacts the wall underneath the layer of semiconductor material. Thus, the newly formed semiconductor material extends out farther at an upper portion than at a lower portion underneath the semiconductor layer.

In one embodiment, the newly formed layer of semiconductor material is utilized as an intrinsic base for a bipolar transistor. The semiconductor layer is utilized as base electrode structure that couples the intrinsic base to a base contact. Maximizing the upper portion increases the area of contact between the intrinsic base and the base electrode structure to reduce the resistance between the two structures. In some embodiments, the semiconductor structure below the base is utilized as an intrinsic collector. In some embodiments, reducing the lateral width of the lower portion of the semiconductor structure reduces the capacitance between the intrinsic base and the intrinsic collector below.

Figure 1:
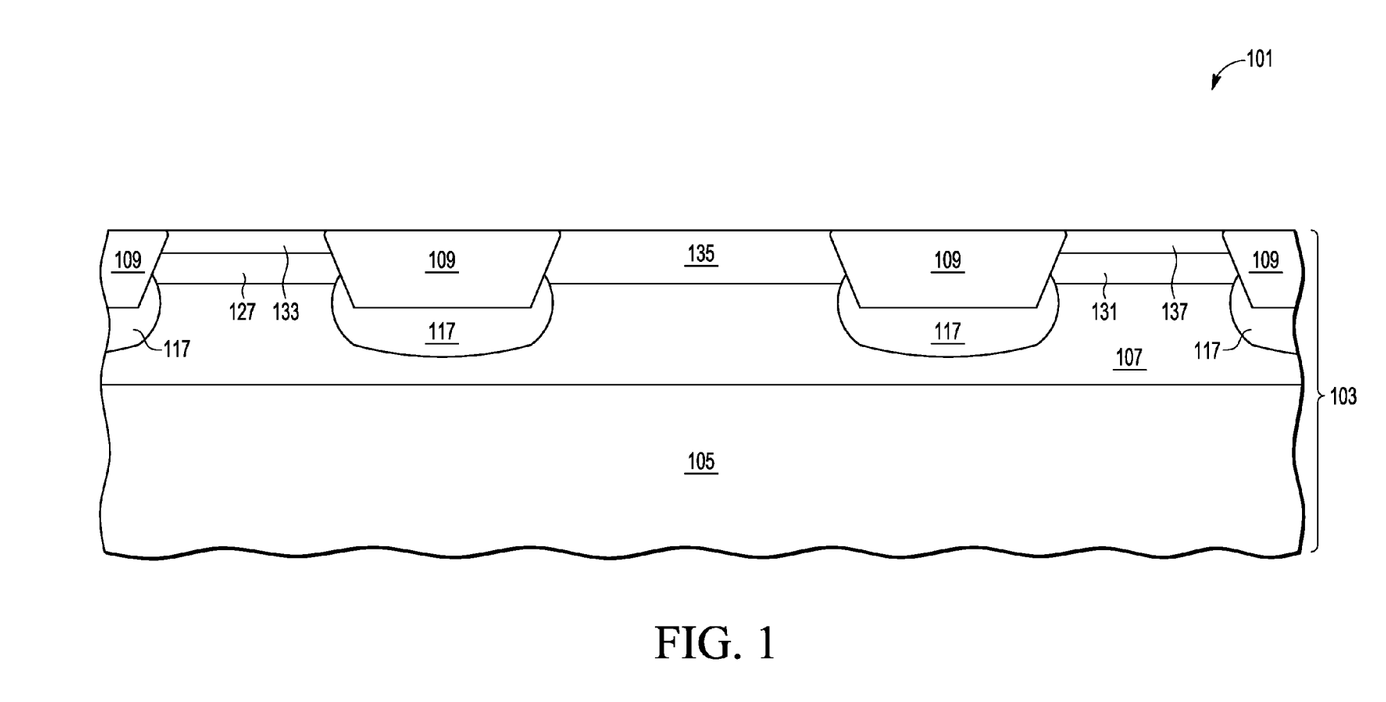
FIGS. 1-10 show partial cutaway side views at various stages in the manufacture of a semiconductor device according to one embodiment of the present invention.

FIG. 1 sets forth a partial cutaway side view of a semiconductor wafer according to one embodiment of the present invention. In one embodiment, wafer 101 includes a substrate 103 of bulk monocrystalline silicon with regions implanted with dopants and dielectric isolation structures formed therein. In one embodiment, substrate 103 has a light P type dopant concentration that is formed in-situ with the formation of the substrate or implanted subsequently. Region 107 is formed by implanting substrate 103 with N type conductivity dopants (e.g. arsenic, phosphorous). In one embodiment region 107 is implanted with arsenic ion dopants at a dosage of $2.5e^{14}/cm^2$ and an energy of 450 keV, but may be implanted with other dopants, at other dosages, and/or at other energies in other embodiments. Region 107 is located over region 105 of substrate 103. At this time, the layers above region 107 (e.g. 135) and region 105 retain the light P dopant profile of substrate 103.

Next, a mask (not shown) is formed over wafer 101 with an opening for implanting collector diffusion region 117. In one embodiment, region 117 is formed by implanting an N type conductivity dopants (e.g. arsenic) into substrate 103. In one embodiment, the arsenic ion dopants for forming region 117 are implanted at a dosage of $6.2e^{15}/cm^2$ and an energy of 90 keV, but may be implanted with other dopants, at other dosages, and/or at other energies in other embodiments. Afterwards, the opening in the mask is used to form a shallow trench isolation structure 109 of a dielectric material (e.g. silicon dioxide). In one embodiment, the dielectric material may be deposited or thermally grown followed by a planarization of substrate 103. The partial cross sectional view of FIG. 1 shows four different portions for each of isolation structure 109 and diffusion region 117. However, at other cross sections of wafer 101, (located into or out of the page from the view of FIG. 1), structure 109 and region 117 would be contiguous across the view of FIG. 1 (e.g. at end regions of a transistor). However, in other embodiments, the portions of structure 109 and/or the portions of region 117 shown in FIG. 1 may be physically separate from each other.

After the formation of isolation structure 109, collector regions 133, 137, 127, and 131 are formed. In one embodiment, regions 127 and 131 are selectively implanted (through a patterned mask not shown) with a first N type dopant implant followed by a second N type dopant implant to form regions 133 and 137. In one embodiment, regions 133 and 137 are formed by implanting arsenic at a dosage of $6.0e^{15}/cm^2$ and an energy of 20 keV, but may be implanted with other dopants, at other dosages, and/or at other energies in other embodiments. In one embodiment, regions 127 and 131 are formed by implanting phosphorous at a dosage of $1.3e^{15}/cm^2$ and an energy of 100 keV, but may be implanted with other dopants, at other dosages, and/or at other energies in other embodiments. In another embodiment, regions 133 and 137 are formed separately at a later step.

Figure 2:
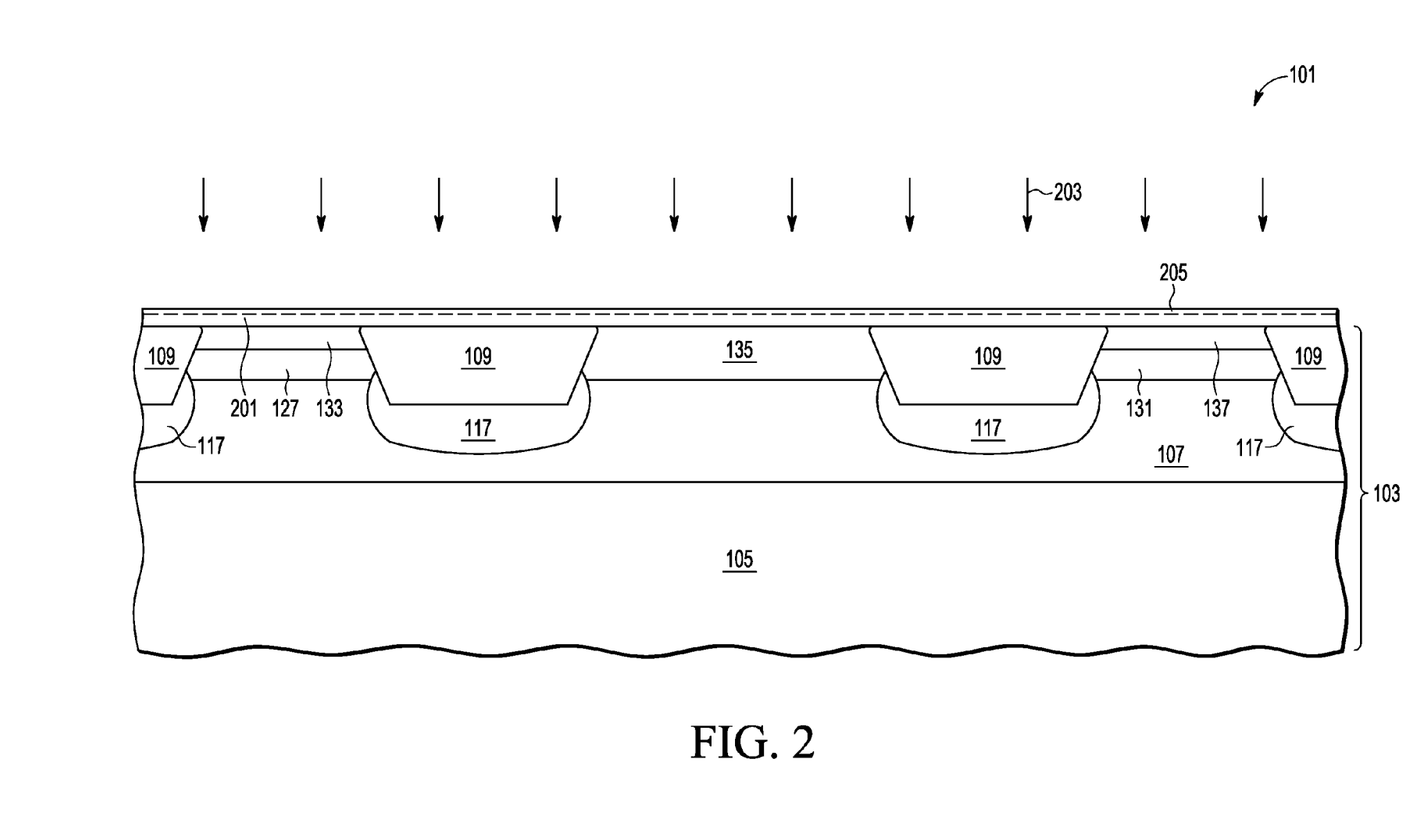

FIG. 2 shows a partial cutaway side view of wafer 101 after oxide layer 201 has been formed on substrate 103 and is implanted with dopants. In one embodiment, silicon oxide layer 201 is 600 angstroms thick and is deposited by a TEOS process. However, layer 201 may have other thicknesses, be deposited by other processes, and/or be made of other dielectric materials in other embodiments. For example, layer 201 may be formed by a thermal oxidation process.

In one embodiment, the implanted dopants 203 are arsenic dopants. In one embodiment, arsenic dopant ions 203 are implanted into the top third of layer 201 as shown by dashed line 205. However, the arsenic dopant ions may be implanted to other depths in other embodiments. The arsenic dopants implanted into the upper portion of layer 201 make the upper portion etch faster than a lower portion of layer 202 during a subsequent selective etching of layer 201. See FIG. 5 and its discussion thereof. In one embodiment, arsenic dopant ions are implanted at a dosage of $5.5e^{15}/cm^2$ and at an energy of 10 keV, but may be implanted at other dosages and/or at other energies in other embodiments. For example, the dosage of the dopants may be in the range of $3.0$-$10.0e^{15}/cm^2$. Also in other embodiments, other types of dopants (e.g. phosphorous) may be implanted into layer 201 to increase the etching rate.

In another embodiment, the dopants (e.g. arsenic) are introduced in-situ with the formation of layer 201. In one embodiment, an arsenic precursor is introduced in the deposition chamber during the latter portion of the deposition of layer 201. In other embodiments, the deposition chamber process conditions during the deposition of layer 201 are modified to increase the etch rate of the upper portion of layer 201 with respect to the lower portion. In one embodiment, a lower deposition temperature during the deposition of the upper portion of layer 201 results in a less dense oxide with a higher etch in the upper portion of layer 201.

In other embodiments, non-conductivity dopants (e.g. xenon, fluorine) may be implanted or introduced into the upper portion of layer 201 to change the etch rate of the upper portion.

Still in other embodiments, dopants could be implanted or introduced in-situ in the lower portion of layer 201 so that the lower portion of layer 201 etches at a slower rate than the upper portion. For example, boron may be introduced in the lower portion of layer 201 to slow the etch rate relative to the upper portion of layer 201.

Figure 3:
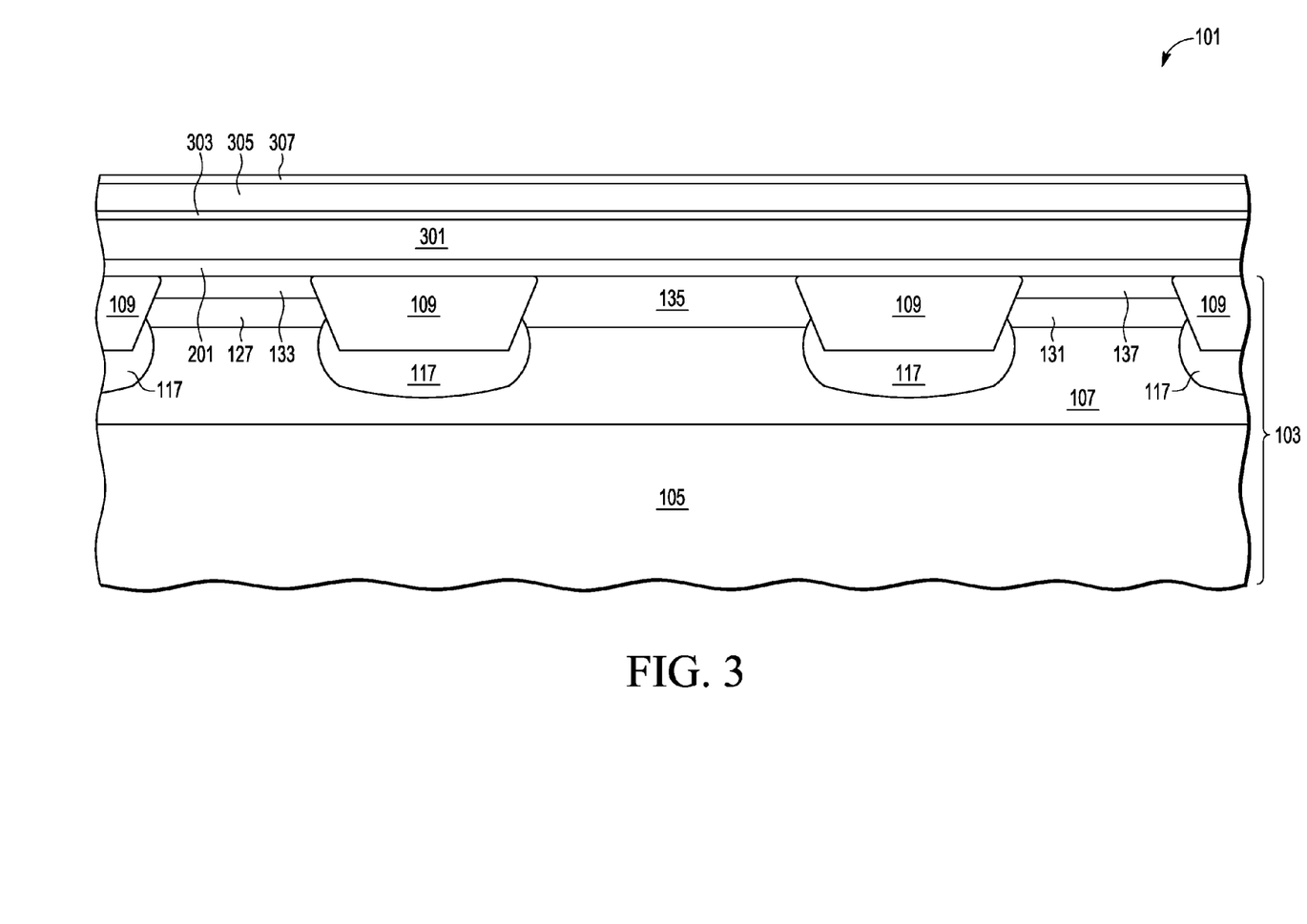

FIG. 3 shows a partial cutaway side view of wafer 101 after a layer 301 of polysilicon is formed on layer 201 followed by the deposition of dielectric layers 303, 305, and 307. In one embodiment, layer 301 is 600 angstroms thick, but may be of other thicknesses in other embodiments. Layer 301 is doped with conductivity dopants (e.g. boron) either in-situ or ion implanted (e.g. at a dosage of $1.4e^{16}/cm^2$ and at an energy of 15 keV).

In one embodiment, layer 303 is an oxide layer (e.g. silicon oxide), layer 305 is a nitride layer (e.g. silicon nitride), and layer 307 is an oxide layer. In one embodiment, layers 303 and 307 have a thickness of 150 angstroms and layer 305 has a thickness of 500 angstrom, but may have other thicknesses in other embodiments.

Figure 4:
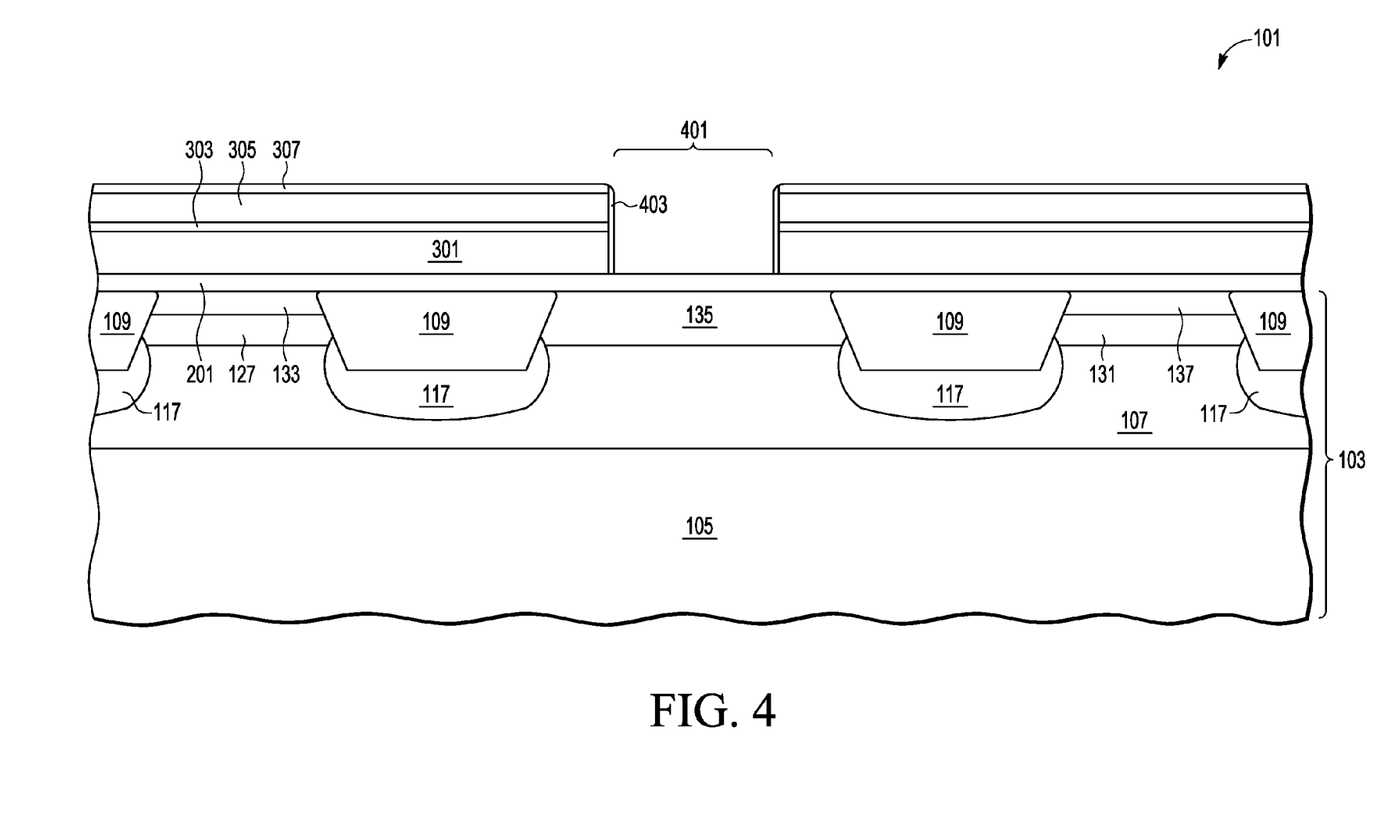

FIG. 4 shows a partial cutaway side view of wafer 101 after an opening 401 is formed in layers 305, 303, 301, and 307 and a nitride spacer 403 is formed on the opening side walls. In one embodiment, the opening is formed by patterning a layer of photo resist or other masking material (not shown) with a corresponding opening and etching layers 301, 303, 305, and 307. Layer 201 is exposed through opening 401. In one embodiment, opening 401 is formed by etching layers 301, 303, 305, and 307 with the appropriate etchants.

In the embodiment shown, spacer 403 is made of silicon nitride. In one embodiment, spacer 403 is formed by forming a layer of silicon nitride (not shown) over wafer 101 and then performing a reactive ion etch to remove the portions of the silicon nitride layer located on the horizontal surfaces of wafer 101. Oxide layer 307 remains on the horizontal surfaces of wafer 101. Spacer 403 may be made by other processes and/or other materials in other embodiments.

Figure 5:
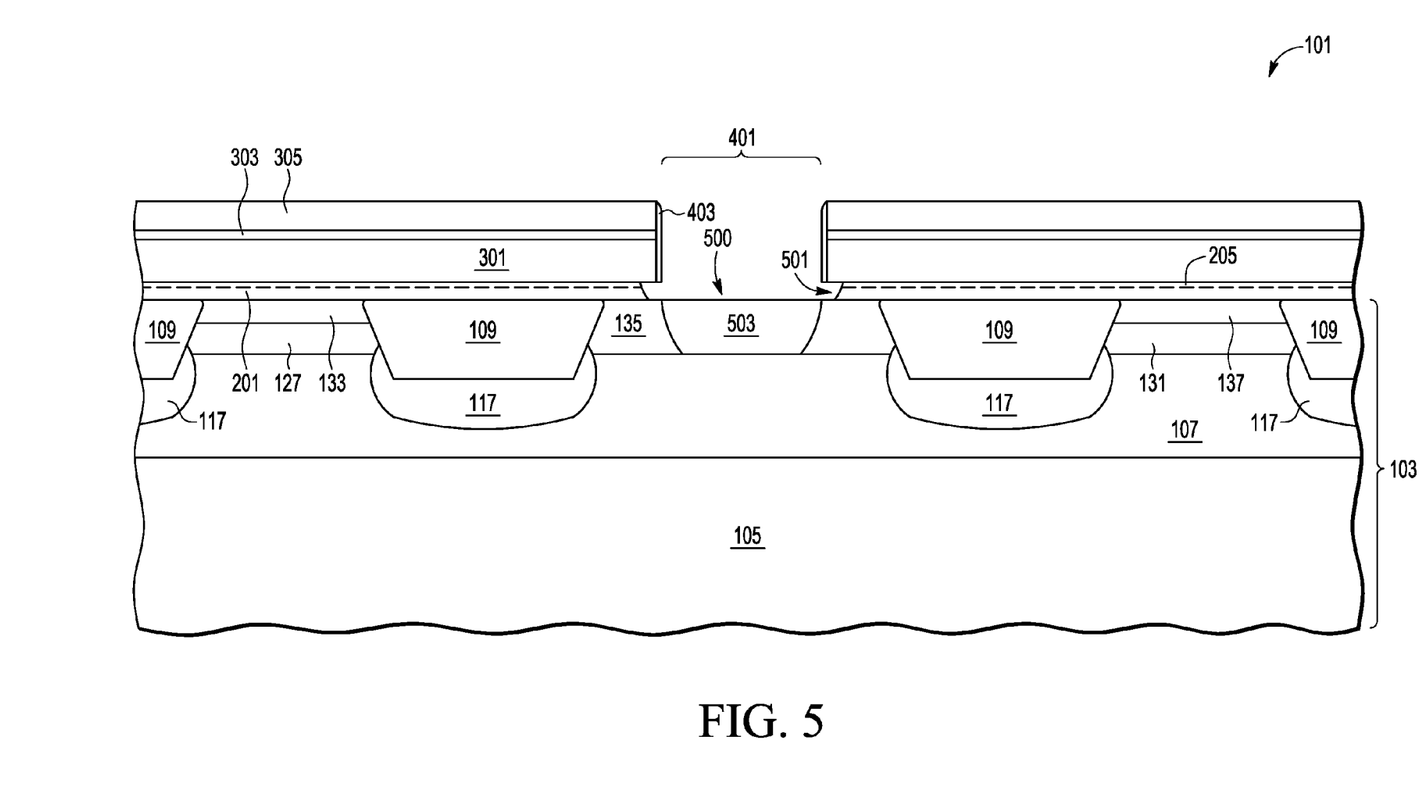

FIG. 5 shows a partial cutaway side view of wafer 101 after a void 500 is formed in layer 201 and collector region 503 is selectively implanted through opening 401. In one embodiment, void 500 is formed in layer 201 by performing a wet etch (isotropic) through opening 401 to etch the exposed portions of layer 201. In one embodiment, this wet etch is performed with hydrofluoric (HF) acid. This wet etch etches out the portion of layer 201 underneath spacer 403 and layer 301 in proximity to opening 401. Because the upper portion of layer 201 was implanted with dopants that change the etch rate, the upper portion of layer 201 (that is shown by dashed line 205 etches faster than the lower portion of layer 201 (below line 205). In one embodiment where layer 201 is silicon oxide, where the upper portion of layer 201 has been implanted with arsenic at a dosage of $5.5e^{15}/cm^2$, and where the etchant is HF acid, the upper portion of layer 201 etches at a rate of 1.7 times faster than the undoped portion of layer 201. In other embodiments, the upper portion of layer 201 may be etched at a rate that is in the range of 1.3 to 2.5 times faster than the lower portion. However, the etch rates may be different for different layer materials, different etch chemistries, or different dopants in other embodiments. During the etching of layer 201, layer 307 is also removed.

In the embodiment shown, the profile of side wall 501 at the upper portion of layer 201 is shown as generally planar along the upper portion above dashed line 205. However, with some embodiments, the sidewall of the top surface of the upper portion of layer 201 may not laterally extend as far away from opening 401 as the sidewall at a lower level of the upper portion. Consequently, the widest portion of void 500 may be at a level in the upper portion of layer 201 just below the level of the top surface of layer 201. In one embodiment, the doping profile in the upper portion of layer 201 is non-uniform, with a higher concentration just below the top surface of layer 201 leading to a higher etch rate and wider void 500 just below the level of the top surface of layer 201.

In one embodiment, lightly doped (or undoped) region 135 is implanted through opening 401 with N type dopant ions (e.g. arsenic, prosperous) to form an intrinsic collector region 503. In one embodiment, the dopant ions are implanted at an energy of 200 keV with a dose of $7.0e^{13}/cm^2$ such that region 503 extends down to region 107. Afterwards, wafer 101 is annealed to activate the dopants of region 503. In one embodiment, the formation of region 503 occurs after the formation of void 500, but may be performed before the formation of void 500 in other embodiments.

Figure 6:
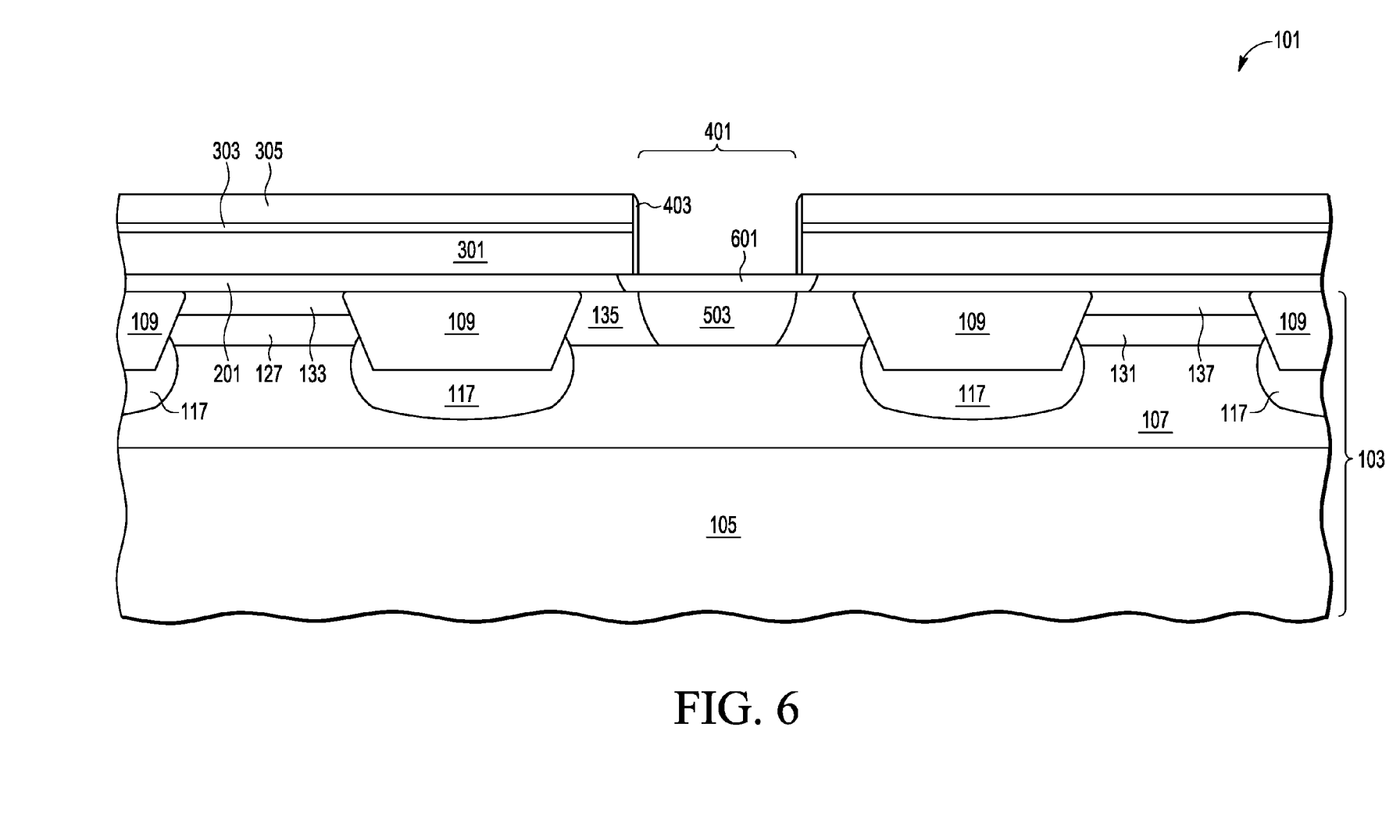

FIG. 6 shows a partial cutaway side view of wafer 101 after a structure 601 of monocrystalline silicon germanium is grown in void 500 including underneath the portions of layer 301. In one embodiment, structure 601 is formed by an epitaxial growth process where the silicon germanium is grown from the exposed portions of regions 135, 503 and layer 301 by the epitaxial process. In one embodiment, structure 601 is in-situ doped with a P type dopant (e.g. boron) at a dose of $4.7e^{13}/cm^2$. In one embodiment, structure 601 is also in-situ doped with carbon at a level of 0.04%. In one embodiment, the germanium content varies from 0% to 30% within structure 601. However, structure 601 may also be formed without carbon or germanium (i.e. only P type silicon). Structure 601 can be formed by other processes and/or be made of other materials (e.g. silicon carbon) in other embodiments. Prior to forming structure 601, wafer 101 is subjected to an HF pre-cleaning process.

Figure 7:
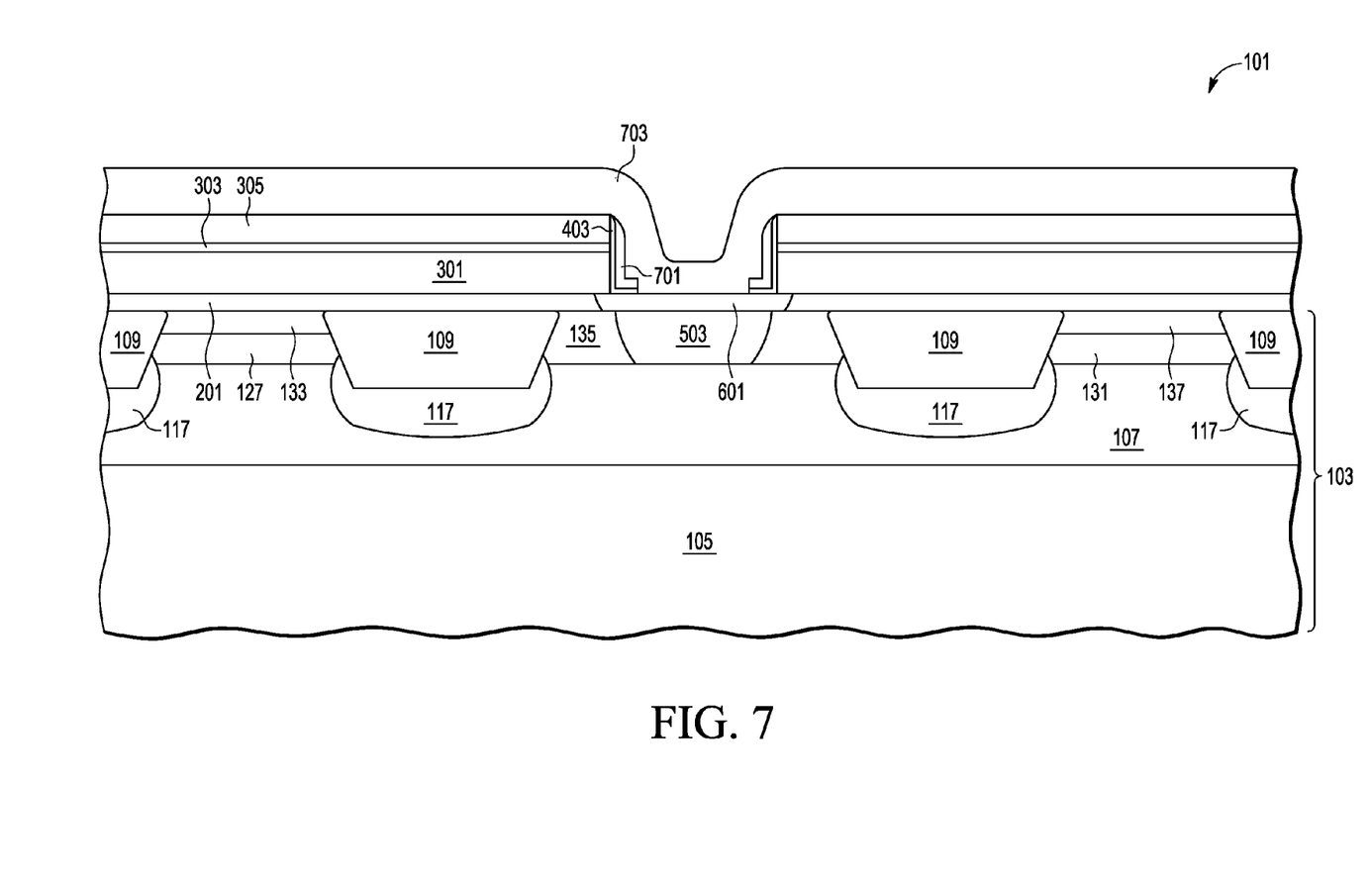

FIG. 7 shows a partial cutaway side view of wafer 101 after the formation of emitter spacer 701 and polysilicon emitter layer 703. In the embodiment shown, spacer 701 is formed on structure 601 next to spacer 403. In one embodiment, spacer 701 is formed by depositing layers of oxide, nitride, and the oxide (none shown) over wafer 101 and then performing a reactive ion etch to form the spacer. In one embodiment, the first deposited oxide layer is 150 angstroms, the nitride layer is 200 angstroms, and the second deposited oxide layer is 500 angstroms, but the layers may be of other thicknesses in other embodiments. After the reactive ion etching, wafer 101 is subjected to an HF pre-clean that removes from spacer 701, the portion formed from the second deposited oxide layer (not shown) and the remainder of the first deposited oxide layer on structure 601.

After the formation of spacer 701, a layer 703 of polysilicon is deposited on wafer 101. In one embodiment, layer 703 has a thickness of 800 angstroms, but may be of other thicknesses in other embodiments.

Figure 8:
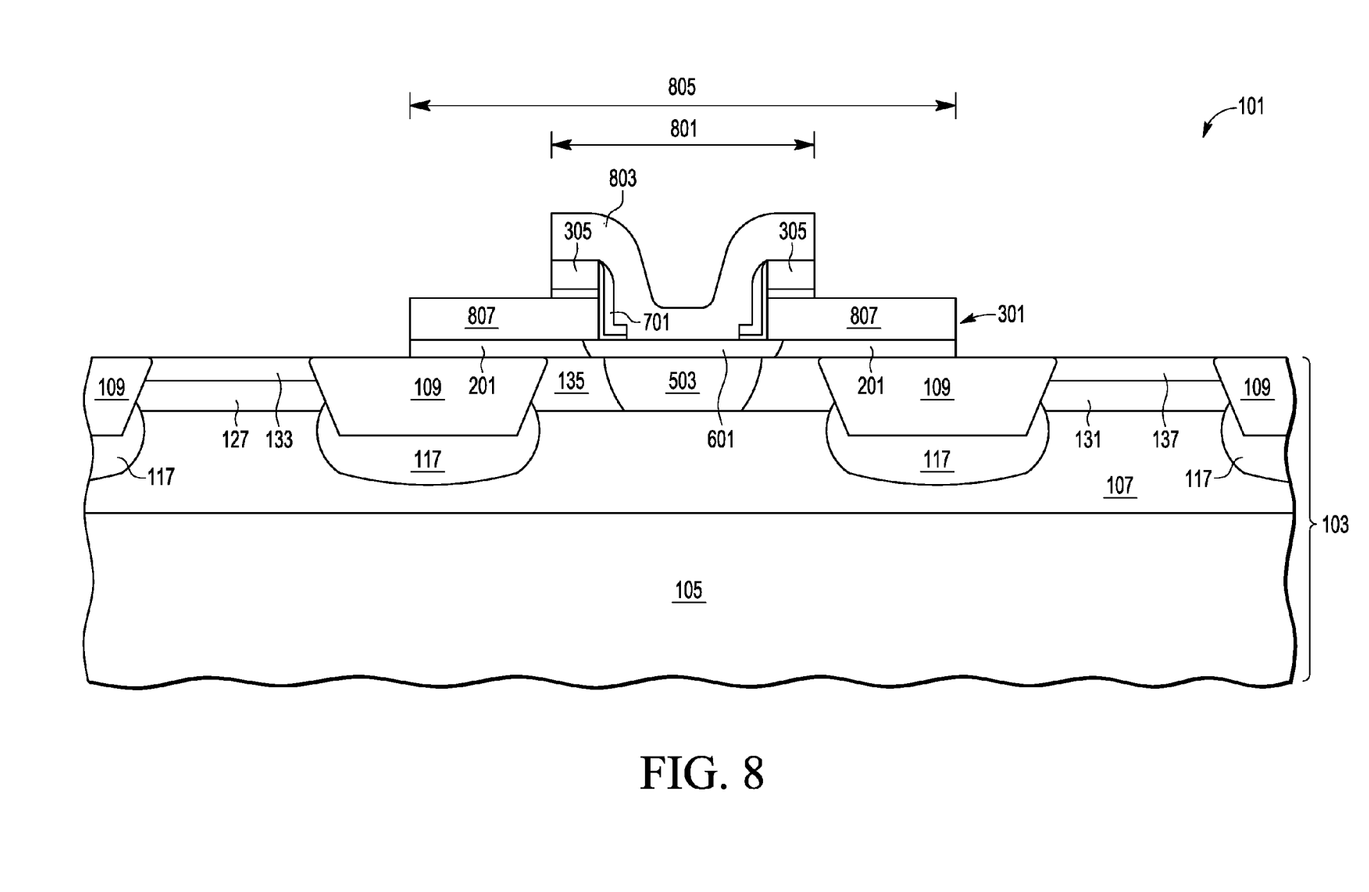

FIG. 8 shows a partial cutaway side view of wafer 101 after structures of wafer 101 have been patterned twice. The first patterning removes the portions of layers 703, 305 and 303, shown in the view of FIG. 8, outside of area 801. Although not shown in the view of FIG. 8, similar portions of these layers would remain in other areas of wafer 101, e.g. where other semiconductor devices are being formed on wafer 101. In one embodiment, these layers are patterned by forming a patterned mask (not shown) over wafer 101 with openings outside of area 801. Layers 703, 305, and 303 are then etched (e.g. by a reactive ion etch) through the openings. Intrinsic emitter 803 is formed from poly silicon layer 703 as a result of the etching.

The second patterning of wafer 101 removes the portions of layers 301 and 201 shown in the view of FIG. 7, outside of area 805. Although not shown in the view of FIG. 8, similar portions of these layers would remain in other areas of wafer 101, e.g. where other semiconductor devices are being formed on wafer 101. In one embodiment, these layers are patterned by forming a patterned mask (not shown) over wafer 101 with openings outside of area 805. Layers 301 and 201 are then etched (e.g. by a reactive ion etch to etch layer 301 followed by an HF wet etch to etch layer 201) through the openings. Base electrode structure 807 is formed by the patterning of layer 301. In the cutaway view of FIG. 8, structure 807 includes two portions located on the left and right of spacer 701 where spacer 701 and a portion of emitter 803 are located in an opening of structure 807 such that structure 807 surrounds spacer 701.

At this point, in one embodiment, regions 133 and 137 are formed by selectively implanting (through a patterned mask not shown) with an N type dopant implant arsenic at a dosage of 6.0e15/cm2 and an energy of 20 keV. Other dopants, at other dosages, and/or at other energies may be implanted in other embodiments. In one embodiment, wafer 101 is annealed at high temperate to activate and diffuse all the dopants (e.g. of intrinsic base structure 601 and intrinsic emitter 803).

Figure 9:
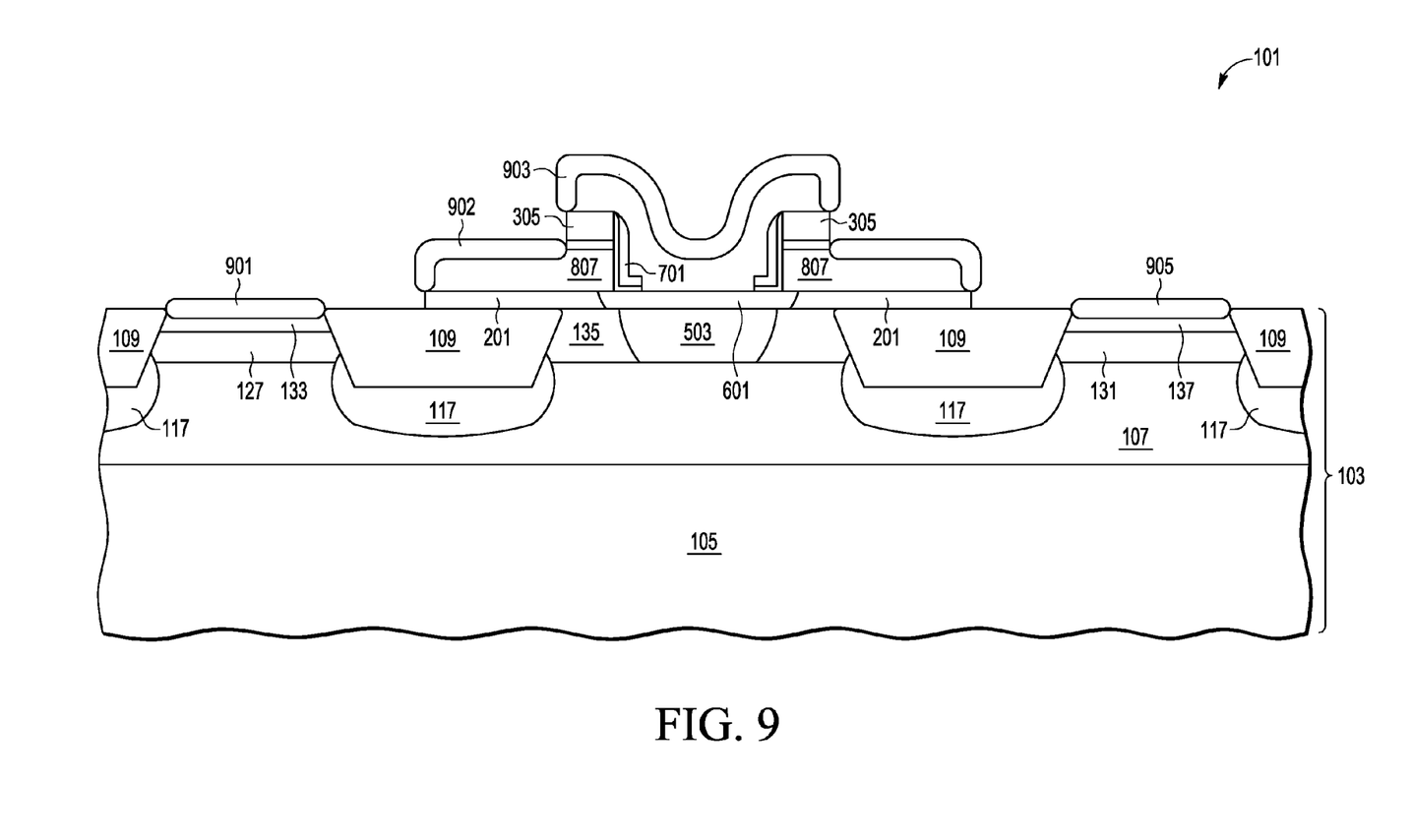

FIG. 9 shows a partial cutaway side view of wafer 101 after silicide structures (901, 902, 903, and 905) are formed on the exposed silicon areas of wafer 101. In one embodiment, the silicide structures are formed by depositing a layer of metal (e.g. nickel, cobalt) over wafer 101 and heating wafer 101 wherein the metal reacts with the exposed silicon to form the silicide. Afterwards, the unreacted metal is removed. In FIG. 9, silicide structure 901 is formed on collector contact region 133, structure 902 is formed on base electrode structure 807, silicide structure 903 is formed on intrinsic emitter 803, and silicide structure 905 is formed on collector contact region 137.

Figure 10:
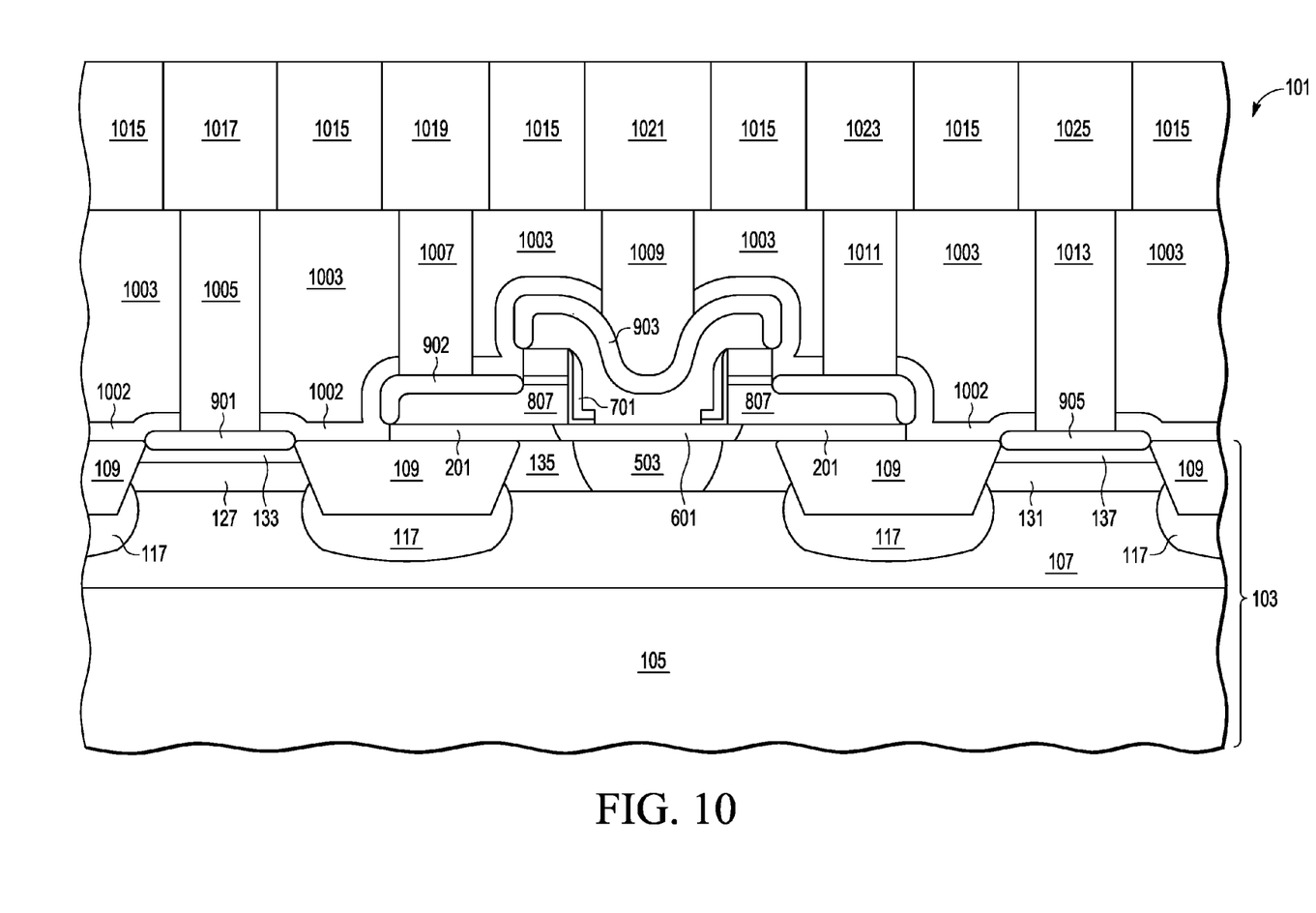

FIG. 10 shows a partial cutaway side view of wafer 101 after the formation of interconnects to the silicide structures. After the formation of silicide structures 901, 902, 903, and 905, a conformal layer 1002 of dielectric material (e.g. nitride) is formed over wafer 101. In one embodiment, layer 1002 has a thickness of 500 angstroms, but may be of other thicknesses in other embodiments. Afterwards a relatively thick layer 1003 of oxide (e.g. formed by a TEOS process) is formed over layer 1002 and planarized (e.g. using chemical mechanical polishing). Openings are then formed in layers 1003 and 1002 to expose silicide structures 901, 902, 903, and 905. A layer of contact material (e.g. tungsten, copper) is formed over wafer 101 including in the openings and then planarized to form isolated plugs 1005, 1007, 1009, 1011, and 1013. In one embodiment, the plugs may include barrier metal layers. A second dielectric layer 1015 is formed over wafer 101. Openings are formed in layer 1015 to expose conductive plugs 1005, 1007, 1009, 1011, and 1013. A layer of interconnect conductive material (e.g. copper) is formed over layer 1015 and subsequently planarized to form interconnect 1017, 1019, 1021, 1023, and 1025. In one embodiment, the conductive material may include barrier metal layers under the copper. Other embodiments may have other conductive structures and/or may be formed in other ways. In other embodiments, the conductive interconnect structures may electrically couple two or more plugs of plugs 1005, 1007, 1009, 1011, and 1013. In one embodiment, collector plugs 1005 and 1013 are electrically coupled.

In the embodiment shown, the transistor formed in water 101 is a bipolar NPN transistor where region 503 is the intrinsic collector and structure 601 is the intrinsic base along with intrinsic emitter 803. Intrinsic base structure 601 is electrically accessible from interconnect 1023 via plug 1011, silicide structure 902, and base electrode structure 807 as well as from interconnect 1019 via plug 1007 and silicide structure 902. Intrinsic emitter 803 is accessible by interconnect 1021, plug 1009, and silicide structure 903. Intrinsic collector region 503 is electrically accessible from interconnect 1025 by plug 1013, silicide structure 905, collector contact region 137, and intermediate collector regions 131, 107, and 117. Intrinsic collector region 503 is also electrically accessible from interconnect 1017 by plug 1005, silicide structure 901, collector contact region 133, and intermediate collector regions 127, 107, and 117. In the embodiment shown, regions 113 and 137 (as well as regions 127 and 131 and silicide structures 901 and 905) are physically separated from each other and are implemented in "finger structures" located along isolation structure 109 opposite each side of collector region 503. However in other embodiments, regions 133 and 137 (as well as regions 127 and 131 and silicide structures 901 and 905) are physically connected at other locations of wafer 101 (e.g. at an end region of the transistor).

The processes herein may be utilized in forming other types of semiconductor devices such as a PNP bipolar transistor, MOSFET, or diode. In one embodiment of forming a PNP bipolar transistor, the P type doped regions and the N type doped regions would be switched from the device of FIG. 10.

After the stage of FIG. 10, further interconnect structures may be formed over layer 1015. External connectors such as bond pads would be formed on wafer 101. Afterwards, wafer 101 is singulated into multiple die with each die including one or more transistors as shown in FIG. 10. Afterwards, the die are packaged in semiconductor packages (e.g. leaded, leadless, BGA, QFN, QFP, or wafer level package).

Figure 11:
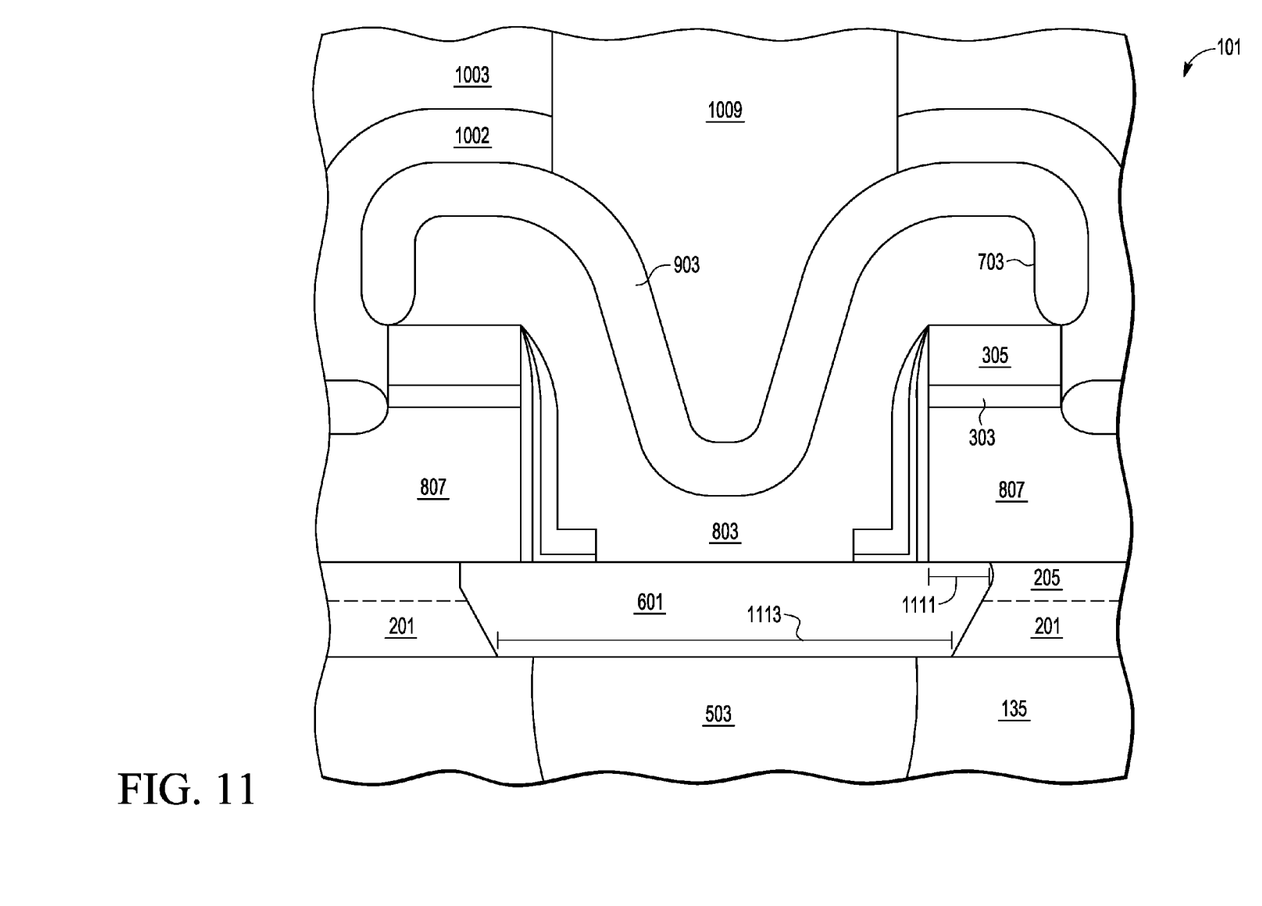
FIG. 11 is a partial cut away side view of a semiconductor device according to one embodiment of the present invention.

FIG. 11 shows a close up view of the partial cutaway view of FIG. 10. FIG. 11 shows the distance 1111 that intrinsic base structure 601 extends underneath base electrode structure 807. The base resistance between base electrode structure 807 and intrinsic base structure 601 is dependent upon distance 1111, with a greater distance providing for a decrease in resistance. The capacitance between the intrinsic base structure 601 and collector region 503 is dependent upon the width 1113 with a smaller width providing for a decrease in capacitance. Thus, minimizing the width may improve transistor performance in some embodiments by decreasing the base collector capacitance.

In some embodiments, providing a layer of dielectric material with an upper portion and a lower portion having different etch rate properties enables for the formation of an intrinsic base structure with a wider upper portion to decrease the base resistance and a narrower lower portion to decrease the base collector capacitance. With some embodiments of the methods described herein, such an intrinsic base region may be formed with a sacrificial dielectric layer having an upper portion and a lower portion that are each etched with the same etchant as opposed to using two layers of different materials. Such methods may reduce the complexity of manufacture of such devices.

The transistors structures described herein can be formed with BICMOS processes, but may be formed by other processes in other embodiments.

As used herein, the term "underneath" means directly below. For example, in the view of FIG. 11, region 503 is underneath structure 601. Although region 503 is at a level of being below the level of layer 201, it is not underneath layer 201.

The terms "intrinsic emitter," "intrinsic base," and "intrinsic collector" are the structures of a bipolar device that form the PN junctions (the collector/base junction and the base/emitter junction) of the bipolar transistor.

In one embodiment, a method of forming a semiconductor device includes forming a layer of dielectric material. An upper portion of the layer of dielectric material has a first etch rate property with respect to an etchant and a lower portion of the layer of dielectric material has a second etch rate property with respect to the etchant. The method includes forming a layer of semiconductor material over the layer of dielectric material and forming an opening in the layer of semiconductor material and exposing the layer of dielectric material through the opening. The method includes etching with the etchant, the layer of dielectric material through the opening to remove a portion of the layer of dielectric material underneath the layer of semiconductor material with the etchant. The upper portion of the layer of dielectric material is removed by etching with the etchant at a faster rate than the lower portion of the layer of dielectric material is removed by the etching with the etchant such that a remaining side wall of the layer of dielectric material defined by the etching underneath the layer of semiconductor material is non planar with an upper portion of the remaining side wall extending laterally farther from the opening than a lower portion of the remaining side wall extending laterally from the opening. The method includes forming a structure of semiconductor material in a location where the layer of dielectric material was removed by the etching. The structure extends underneath the layer of semiconductor material to contact a bottom surface of the layer of semiconductor material underneath the layer of semiconductor material. The structure has a structure side wall with an upper portion corresponding to the upper portion of the remaining side wall that extends farther underneath the layer of semiconductor material than a lower portion of the structure side wall that corresponds to the lower portion of the remaining side wall.

In another embodiment, a semiconductor device includes a first semiconductor structure and a second semiconductor structure having a first side wall. A portion of the first semiconductor structure extends underneath the second semiconductor structure from the first side wall and has a top surface in contact with a bottom surface of the second semiconductor structure underneath the second semiconductor structure. The semiconductor device includes a layer of dielectric material underneath the second semiconductor structure. The layer of dielectric material has a second side wall laterally in contact with the portion of the first semiconductor structure. The first semiconductor structure has an upper portion and a lower portion, wherein the upper portion is wider than the lower portion and wherein the upper portion of the first semiconductor structure contacts an upper portion of the layer of dielectric material at the second side wall and the lower portion of the first semiconductor structure contacts a lower portion of the layer of dielectric material at the second side wall. The upper portion of the layer of dielectric material has a first etch rate property that etches at a first rate with an etchant and the lower portion of the layer of dielectric material has a second etch rate property that etches at a second rate with the etchant. The first rate is faster than the second rate.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:
1. A method of forming a semiconductor device comprising:

forming a layer of dielectric material, wherein an upper portion of the layer of dielectric material has a first etch rate property with respect to an etchant and a lower portion of the layer of dielectric material has a second etch rate property with respect to the etchant;

forming a layer of semiconductor material over the layer of dielectric material;

forming an opening in the layer of semiconductor material and exposing the layer of dielectric material through the opening;

etching with the etchant, the layer of dielectric material through the opening to remove a portion of the layer of dielectric material underneath the layer of semiconductor material with the etchant, wherein the upper portion of the layer of dielectric material is removed by etching with the etchant at a faster rate than the lower portion of the layer of dielectric material is removed by the etching with the etchant such that a remaining side wall of the layer of dielectric material defined by the etching underneath the layer of semiconductor material is non planar with an upper portion of the remaining side wall extending laterally farther from the opening than a lower portion of the remaining side wall extending laterally from the opening;

forming a structure of semiconductor material in a location where the layer of dielectric material was removed by the etching, wherein the structure extends underneath the layer of semiconductor material to contact a bottom surface of the layer of semiconductor material underneath the layer of semiconductor material, the structure having a structure side wall with an upper portion corresponding to the upper portion of the remaining side wall that extends farther underneath the layer of semiconductor material than a lower portion of the structure side wall that corresponds to the lower portion of the remaining side wall.

2. The method of claim 1 wherein the forming a layer of dielectric material includes:

forming the layer of dielectric material; and implanting dopants into the upper portion of the layer of dielectric material to provide the upper portion of the layer of dielectric material with a higher concentration of the dopants than the lower portion of the layer of dielectric material to provide the upper portion with the first etch rate property with respect to the second etch rate property.

3. The method of claim 1, wherein the forming the layer of dielectric material includes in-situ doping the upper portion with dopants to provide the upper portion of the layer of dielectric material with a higher concentration of the dopants than the lower portion of the layer of dielectric material to provide the upper portion with the first etch rate property with respect to the second etch rate property.

4. The method of claim 1 wherein the semiconductor device includes a second structure of semiconductor material underneath and in contact with the structure of semiconductor material, wherein the structure of semiconductor material has a first conductivity doping profile that is opposite a conductivity doping profile of the second structure of semiconductor material.

5. The method of claim 4 wherein the structure of semiconductor material is characterized as an intrinsic base of the semiconductor device and the second structure of semiconductor material is characterized as an intrinsic collector of the semiconductor device.

6. The method of claim 4 wherein the second structure of semiconductor material includes conductivity dopants implanted into a layer of semiconductor material through the opening.

7. The method of claim 1 wherein the structure of semiconductor material is characterized as an intrinsic base of the semiconductor device wherein a portion of the layer of semiconductor material in which the structure of semiconductor material is located underneath is characterized as a base electrode of the semiconductor device.

8. The method of claim 1 wherein the dielectric material is characterized as an oxide.

9. The method of claim 1 wherein the etchant includes hydrofluoric (HF) acid.

10. The method of claim 1 wherein the etching includes etching the upper portion of the layer of dielectric material with the etchant at a first rate and etching the lower portion of the dielectric material by with the etchant at a second rate, wherein the first rate is in a range 1.3 to 2.5 times faster than the second rate.

11. The method of claim 1 wherein the upper portion of the layer of dielectric material has a higher concentration of dopants than the lower portion of the layer of dielectric material to provide the upper portion with the first etch rate property with respect to the second etch rate property.

12. The method of claim 11 wherein the dopants include arsenic at a concentration in the upper portion in the range of 1.0e20 to 1.0e22/cm3.

13. The method of claim 1 wherein the lower portion of the layer of dielectric material has a higher concentration of dopants than the upper portion of the layer of dielectric material to provide the lower portion with the second etch rate property with respect to the first etch rate property.

14. The method of claim 1 wherein after forming the structure of semiconductor material, forming a second structure of semiconductor material over and in contact with the structure, wherein at least a portion of the second structure is located in the opening, wherein the structure of semiconductor material is characterized as an intrinsic base of the semiconductor device and the second structure is characterized as an intrinsic emitter of the semiconductor device.

* * * * *